(12) United States Patent
Lee

(10) Patent No.: US 11,374,160 B1
(45) Date of Patent: Jun. 28, 2022

(54) THERMOELECTRIC MODULE

(71) Applicants: Hyundai Motor Company, Seoul (KR); Kia Corporation, Seoul (KR)

(72) Inventor: Min Jae Lee, Seongnam-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 0 days.

(21) Appl. No.: 17/475,510

(22) Filed: Sep. 15, 2021

(30) Foreign Application Priority Data

May 18, 2021 (KR) .................. 10-2021-0064366

(51) Int. Cl.
*H01L 35/32* (2006.01)
*H01L 35/30* (2006.01)

(52) U.S. Cl.
CPC .............. *H01L 35/32* (2013.01); *H01L 35/30* (2013.01)

(58) Field of Classification Search
CPC ................................ H01L 35/30; H01L 35/32
See application file for complete search history.

(56) References Cited

U.S. PATENT DOCUMENTS

| | | | | |
|---|---|---|---|---|
| 5,561,981 A * | 10/1996 | Quisenberry | ........... | H01L 35/30 62/3.5 |
| 8,997,502 B2 * | 4/2015 | Ayres | ........... | H01L 35/32 62/3.2 |
| 2002/0038550 A1 * | 4/2002 | Gillen | ........... | H01L 35/30 62/3.2 |
| 2007/0034356 A1 * | 2/2007 | Kenny | ........... | F28D 15/0266 257/E23.098 |
| 2007/0056621 A1 * | 3/2007 | Baskaran | ........... | H01L 35/16 136/203 |
| 2009/0014046 A1 * | 1/2009 | Yu | ........... | H01L 35/34 264/319 |
| 2012/0049316 A1 * | 3/2012 | Kim | ........... | H01L 35/34 438/54 |
| 2012/0067986 A1 * | 3/2012 | Kobayashi | ........... | H01L 35/34 239/690 |
| 2013/0227966 A1 * | 9/2013 | Ayres | ........... | H05K 13/00 62/3.2 |
| 2016/0111623 A1 * | 4/2016 | Lee | ........... | H01L 35/32 136/208 |
| 2016/0149106 A1 * | 5/2016 | Hong | ........... | H01L 35/30 136/205 |
| 2017/0163065 A1 * | 6/2017 | Freer | ........... | H02J 7/00 |
| 2018/0269367 A1 * | 9/2018 | Melsert | ........... | C02F 1/281 |
| 2019/0056147 A1 * | 2/2019 | Brisebois | ........... | F24S 50/00 |
| 2020/0144474 A1 * | 5/2020 | Sugiura | ........... | H01L 35/26 |
| 2020/0182514 A1 * | 6/2020 | Kosar | ........... | F24V 40/10 |
| 2022/0069190 A1 * | 3/2022 | Kim | ........... | H01L 35/18 |

FOREIGN PATENT DOCUMENTS

GB 2566602 A * 3/2019 ............ F24F 5/0042

* cited by examiner

*Primary Examiner* — Golam Mowla
(74) *Attorney, Agent, or Firm* — Morgan, Lewis & Bockius LLP

(57) ABSTRACT

A thermoelectric module may include a unit thermoelectric member having a contact portion configured to come into contact with a subject; and a hydrophobic pattern disposed on the contact portion and configured to guide condensate water produced on the contact portion, to the outside of the contact portion, inhibiting stagnation of the condensate water on the contact portion and improving comfort.

12 Claims, 6 Drawing Sheets

THERMOELECTRIC MODULE

CROSS-REFERENCE TO RELATED APPLICATION

The present application claims priority to Korean Patent Application No. 10-2021-0064366 filed on May 18, 2021, the entire contents of which is incorporated herein for all purposes by this reference.

BACKGROUND OF THE INVENTION

Field of the Invention

The present invention relates to a thermoelectric module, and more particularly, to a thermoelectric module capable of improving comfort while reducing displeasure.

Description of Related Art

Because a temperature control system using an air conditioning device controls a temperature based on a temperature of air, the temperature control system requires a large amount of energy consumption, and it takes a lot of time for a user to sense a change in temperature. As a result, there is a limitation in that it is difficult to improve temperature control efficiency and energy efficiency to a certain level or higher.

Recently, a temperature control system has been developed, in which a thermoelectric module capable of heating and cooling is brought into direct contact with a user.

In general, the thermoelectric module is manufactured by connecting electrodes to P-type thermoelectric materials and N-type thermoelectric materials disposed on a substrate and has an advantage of a low thermal loss and quick temperature control.

Meanwhile, when the thermoelectric module is used to cool a subject (e.g., a human body), condensate water is produced on a contact portion of the thermoelectric module (a low-temperature portion of the thermoelectric module), which is in contact with the subject, due to a temperature difference from the periphery thereof (e.g., surrounding air).

However, generally, the condensate water produced on the low-temperature portion of the thermoelectric module is not smoothly discharged to the outside of the contact portion but stagnates between the thermoelectric module and a contact target portion (e.g., a contact site of the human body). Accordingly, the amount of stagnating condensate water increases over the usage time, which causes an increase in displeasure and a decrease in comfort.

Furthermore, when the condensate water stagnates on the contact portion of the thermoelectric module, the performance of the thermoelectric module deteriorates, and unnecessary power consumption increases.

Therefore, recently, various studies are conducted to minimize the stagnation of the condensate water produced on the low-temperature portion of the thermoelectric module and improve comfort, but the study results are still insufficient. Accordingly, there is a need to develop a technology to minimize the stagnation of the condensate water and improve comfort.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a thermoelectric module configured for improving comfort while reducing displeasure.

The present invention, in various aspects, has also been made in an effort to minimize stagnation of condensate water produced on a contact surface of a thermoelectric module, which is in contact with a subject, improving comfort.

The present invention, in various aspects, has also been made in an effort to minimize deterioration in performance of the thermoelectric module and improve energy efficiency.

The present invention, in various aspects, has also been made in an effort to minimize a leakage of condensate water to the outside and implement a fresh, comfortable usage environment.

The objects to be achieved by the exemplary embodiments are not limited to the above-mentioned objects, but also include objects or effects which may be understood from the solutions or embodiments described below.

Various aspects of the present invention provide a thermoelectric module including: a unit thermoelectric member having a contact portion configured to come into contact with a subject; and a hydrophobic pattern disposed on the contact portion and configured to guide condensate water produced on the contact portion, to the outside of the contact portion.

This is to minimize stagnation of condensate water produced in the thermoelectric module and improve comfort.

That is, when the thermoelectric module is used to cool a subject (e.g., a human body), condensate water is produced on a contact portion of the thermoelectric module (a low-temperature portion of the thermoelectric module), which is in contact with the subject, due to a temperature difference from the periphery thereof (e.g., surrounding air). However, generally, the condensate water produced on the low-temperature portion of the thermoelectric module is not smoothly discharged to the outside of the contact portion but stagnates between the thermoelectric module and a contact target portion (e.g., a contact site of the human body). Accordingly, the amount of stagnating condensate water increases over the usage time, which causes an increase in displeasure and a decrease in comfort. Furthermore, when the condensate water stagnates on the contact portion of the thermoelectric module, the performance of the thermoelectric module deteriorates, and unnecessary power consumption increases.

In contrast, according to the exemplary embodiment of the present invention, the hydrophobic pattern may be disposed on the contact portion configured to come into contact with the subject, thereby guiding the condensate water, produced on the contact portion, to the outside of the contact portion. Therefore, it is possible to obtain an advantageous effect of minimizing the stagnation of the condensate water on the contact portion of the thermoelectric module and improving comfort.

Among other things, according to the exemplary embodiment of the present invention, the hydrophobic pattern having hydrophobicity may be disposed on the contact portion (the portion that comes into contact with a subject) of the thermoelectric module, which makes it possible to inhibit the condensate water from adhering to or stagnating on the portion where the hydrophobic pattern is provided. Therefore, it is possible to push out the condensate water, which is produced on the contact portion, toward the portion where no hydrophobic pattern is provided, thereby guiding the condensate water to the outside of the contact portion.

According to the exemplary embodiment of the present invention, the unit thermoelectric member may include at least one of an N-type thermoelectric material and a P-type thermoelectric material.

For example, the unit thermoelectric member may include: an N-type thermoelectric material; a P-type thermoelectric material spaced from the N-type thermoelectric material; a first electrode electrically connecting a first end portion of the N-type thermoelectric material and a first end portion of the P-type thermoelectric material; and second electrodes respectively connected to a second end portion of the N-type thermoelectric material and a second end portion of the P-type thermoelectric material.

According to the exemplary embodiment of the present invention, the hydrophobic pattern may guide the condensate water produced on an external surface of the first electrode, to an external region of the second electrodes.

This to allow the condensate water, which is guided to the outside of the contact portion by the hydrophobic pattern, to fall into the external region of the second electrode, not onto an upper surface of the second electrode.

That is, the hydrophobic pattern may be configured such that the condensate water, which is guided to the outside of the contact portion by the hydrophobic pattern, falls onto the upper surface of the second electrode. However, the condensate water remaining on the upper surface of the second electrode may degrade energy efficiency and the performance of the thermoelectric module and make it difficult to stably supply power.

In contrast, according to the exemplary embodiment of the present invention, since the condensate water, which is guided to the outside of the contact portion by the hydrophobic pattern, falls into the external region of the second electrode, the amount of condensate water remaining on the upper surface of the second electrode may be minimized. Therefore, it is possible to obtain an advantageous effect of stably supplying power and minimizing the deterioration in performance of the thermoelectric module caused by the condensate water.

The hydrophobic pattern may have various structures in accordance with required conditions and design specifications.

For example, the hydrophobic pattern may include: a first pattern provided in a first direction and disposed on the external surface of the first electrode; and a second pattern disposed on the external surface of the first electrode and connected to the first pattern to be directed in a second direction that intersects the first direction.

The second electrode may be provided in a longitudinal direction of the first electrode, and a portion of the second electrode may be disposed to overlap the first electrode. The first pattern may be provided to cover an outermost peripheral edge portion in the longitudinal direction (the left and right direction based on FIG. 3) of the first electrode.

As described above, the first pattern may cover the outermost peripheral edge portion in the longitudinal direction of the first electrode, which makes it possible to inhibit the condensate water produced on the contact portion from falling onto the upper surface of the second electrode through the outermost peripheral edge portion in the longitudinal direction of the first electrode. Therefore, it is possible to obtain an advantageous effect of stably supplying power and minimizing the deterioration in performance of the thermoelectric module caused by the condensate water.

According to the exemplary embodiment of the present invention, the thermoelectric module may include an absorbing member connected to the unit thermoelectric member and configured to absorb the condensate water.

As described above, the absorbing members may be provided, which makes it possible to inhibit the condensate water, which is pushed out from the contact portion, from falling at an inadvertent position. Therefore, it is possible to obtain an advantageous effect of generating a more comfortable usage environment and reducing displeasure.

According to the exemplary embodiment of the present invention, the thermoelectric module may include a heat sink connected to the unit thermoelectric member.

As described above, the heat sink may be connected to the unit thermoelectric member, and the heat, which exceeds a heat capacity of the unit thermoelectric member, may be discharged (transferred) to the heat sink (e.g., the heat generated from the unit thermoelectric member may be discharged to the heat sink having a relatively high heat capacity). Therefore, it is possible to obtain an advantageous effect of further improving heat transfer efficiency and cooling performance of the thermoelectric module.

The heat sink may be made of a porous material having pores, and each of the pores may be filled with the absorbing member.

Since the pores of the heat sink are filled with the absorbing members as described above, it is possible to obtain an advantageous effect of simplifying the structure of the thermoelectric module and improving the spatial utilization and the degree of design freedom of the thermoelectric module.

According to the exemplary embodiment of the present invention, the thermoelectric module may include a fan configured to generate a forced air flow toward the heat sink.

As described above, the fan may be used to generate the forced air flow toward the heat sink, which makes it possible to cool the heat sink. Therefore, it is possible to obtain an advantageous effect of further improving the heat dissipation performance (heat capacity) of the heat sink.

Moreover, the fan may not only cool the heat sink, but also dry the absorbing member to remove the absorbed condensate water. Therefore, it is possible to obtain an advantageous effect of stably maintaining the water-absorbing performance of the absorbing member and minimizing a leakage (e.g., dropping) of the condensate water to the outside.

According to the exemplary embodiment of the present invention, the thermoelectric module may include a first through-hole provided by penetrating the first electrode and configured to discharge the condensate water from the contact portion through the first through-hole; a second through-hole provided in at least one of the N-type thermoelectric material and the P-type thermoelectric material and configured to fluidically communicate with the first through-hole; and a third through-hole provided in the second electrodes and configured to fluidically communicate with the second through-hole.

As described above, the thermoelectric module may include the first through-hole, the second through-hole, and the third through-hole that continuously fluidically communicate with one another, which makes it possible to discharge the condensate water, which is produced on the contact portion, to the absorbing member (or the lower portion of the second electrode) through the first through-hole, the second through-hole, and the third through-hole. Therefore, it is possible to obtain an advantageous effect of minimizing the amount of condensate water stagnating (remaining) on the contact portion and reducing the time required to discharge the condensate water.

According to the exemplary embodiment of the present invention, the thermoelectric module may include a guide member provided between the unit thermoelectric member and the absorbing member and configured to guide the condensate water from the unit thermoelectric member to the absorbing member through the guide member.

For example, the guide member may have a cross-sectional area that gradually increases from a first end portion thereof adjacent to the unit thermoelectric member toward a second end portion thereof adjacent to the absorbing member.

As described above, the guide member may have the cross-sectional area that gradually increases from one end portion thereof toward the other end portion thereof, which makes it possible to disperse the condensate water, guided by the guide member, over a wider area. Therefore, it is possible to obtain an advantageous effect of further improving condensate water-absorbing efficiency and performance of the absorbing member.

A hydrophobic coating layer may be disposed on a surface of the guide member. As described above, the hydrophobic coating layer may be disposed on the surface of the guide member, which makes it possible to allow the condensate water flowing downward along the surface of the guide member to be more rapidly absorbed by the absorbing member.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
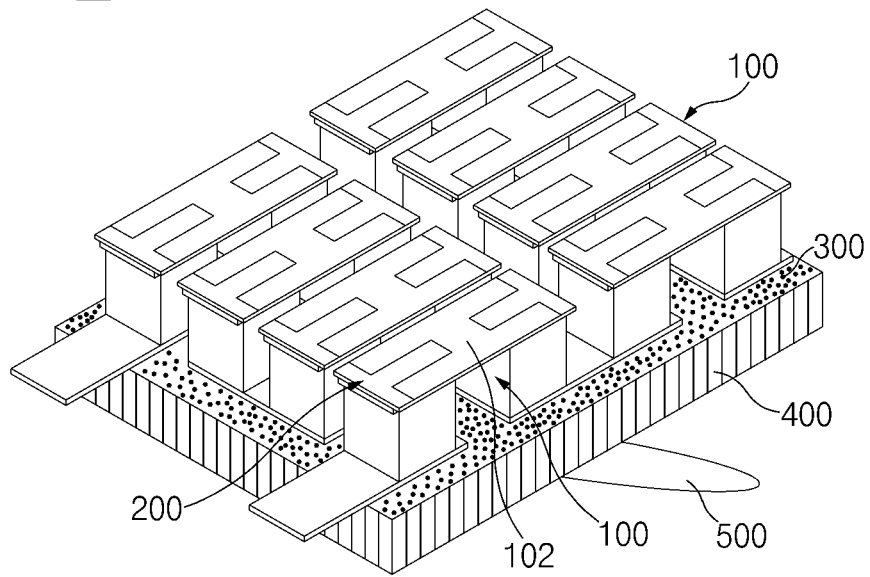
FIG. 1 is a view for explaining a thermoelectric module according to various exemplary embodiments of the present invention.
Figure 2:
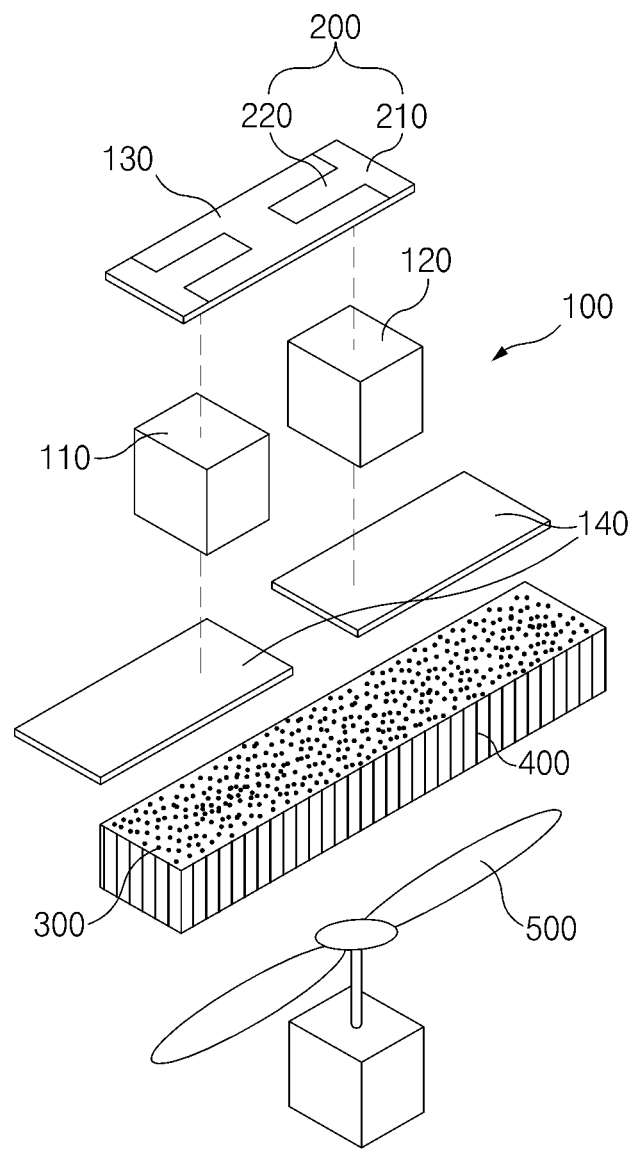
FIG. 2 and FIG. 3 are views for explaining a hydrophobic pattern of the thermoelectric module according to the exemplary embodiment of the present invention.
Figure 3:
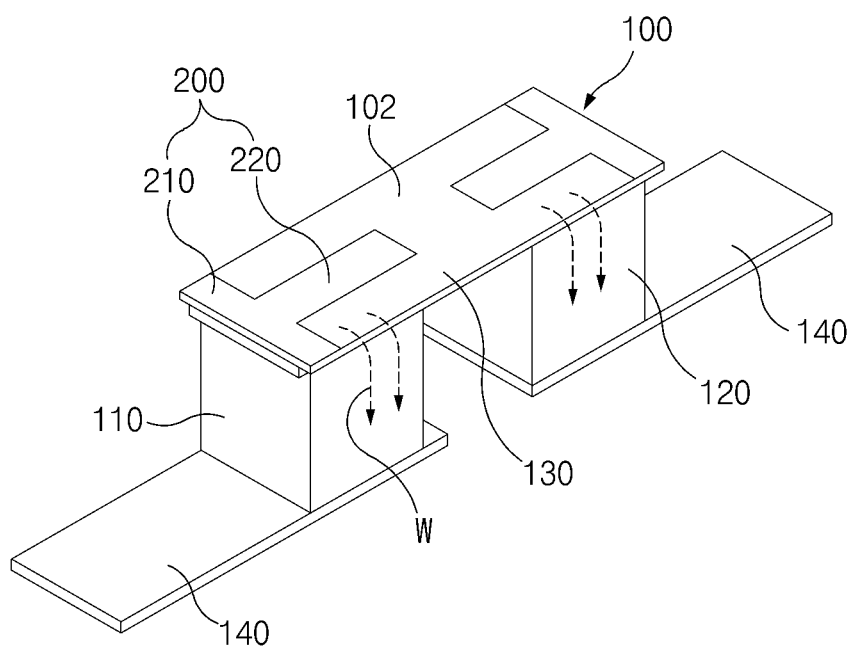
Figure 4:
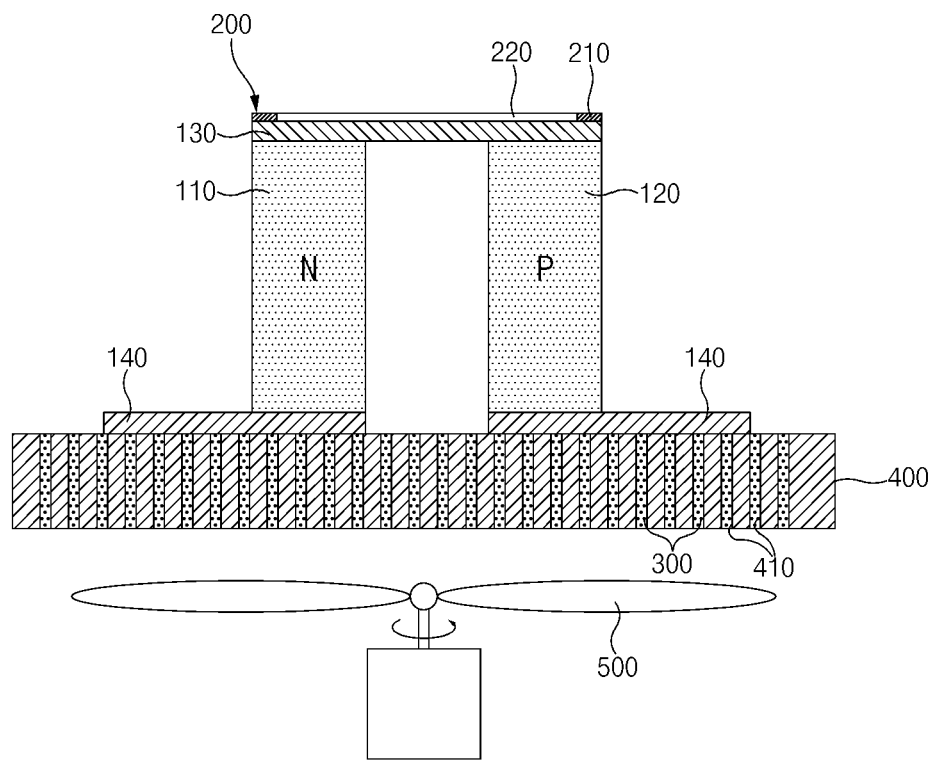
FIG. 4 is a view for explaining an absorbing member of the thermoelectric module according to the exemplary embodiment of the present invention.

It may be understood that the appended drawings are not necessarily to scale, presenting a somewhat simplified representation of various features illustrative of the basic principles of the present invention. The specific design features of the present invention as disclosed herein, including, for example, specific dimensions, orientations, locations, and shapes will be determined in part by the particular intended application and use environment.

In the figures, reference numbers refer to the same or equivalent portions of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, embodiments of the present invention will be described in detail with reference to the accompanying drawings.

However, the technical spirit of the present invention is not limited to various exemplary embodiments described herein but may be implemented in various different forms. One or more of the constituent elements in the exemplary embodiments may be selectively combined and substituted for use within the scope of the technical spirit of the present invention.

Furthermore, unless otherwise specifically and explicitly defined and stated, the terms (including technical and scientific terms) used in the exemplary embodiments of the present invention may be construed as the meaning which may be commonly understood by the person with ordinary skill in the art to which various exemplary embodiments of the present invention pertains. The meanings of the commonly used terms such as the terms defined in dictionaries may be interpreted in consideration of the contextual meanings of the related technology.

Furthermore, the terms used in the exemplary embodiments of the present invention are for explaining the embodiments, not for limiting the present invention.

In the present specification, unless particularly stated otherwise, a singular form may also include a plural form. The expression "at least one (or one or more) of A, B, and C" may include one or more of all combinations that can be made by combining A, B, and C.

Furthermore, the terms such as first, second, A, B, (a), and (b) may be used to describe constituent elements of the exemplary embodiments of the present invention.

These terms are used only for discriminating one constituent element from another constituent element, and the nature, the sequences, or the orders of the constituent elements are not limited by the terms.

Furthermore, when one constituent element is referred to as being 'connected', 'coupled', or 'attached' to another constituent element, one constituent element may be connected, coupled, or attached directly to another constituent element or connected, coupled, or attached to another constituent element through yet another constituent element interposed therebetween.

Furthermore, the expression "one constituent element is provided or disposed above (on) or below (under) another constituent element" includes not only a case in which the two constituent elements are in direct contact with each other, but also a case in which one or more other constituent elements are provided or disposed between the two constituent elements. The expression "above (on) or below (under)" may mean a downward direction as well as an upward direction based on one constituent element.

Referring to FIGS. 1 to 6, a thermoelectric module 10 according to the exemplary embodiment of the present invention includes: unit thermoelectric members 100 each including a contact portion 102 which may come into contact with a subject; and hydrophobic patterns 200 disposed on the contact portions 102, respectively, and each configured to guide condensate water produced on the contact portion 102 to the outside of the contact portion 102.

For reference, the thermoelectric module 10 according to the exemplary embodiment of the present invention may be mounted on various subjects, and the present invention is not restricted or limited by the type and structure of the subject.

Hereinafter, an example will be described in which the thermoelectric module 10 according to the exemplary embodiment of the present invention is mounted on a portion of a human body to cool the portion of the human body.

The unit thermoelectric member 100 includes the contact portion 102 which may come into contact with the subject (e.g., the human body).

For example, the contact portion 102 may have a flat or curved surface which may come into contact with the subject. The present invention is not restricted or limited by the structure and shape of the contact portion 102.

Hereinafter, an example will be described in which the contact portion 102 of the unit thermoelectric member 100 has a flat surface corresponding to each of second electrodes 140.

The thermoelectric module 10 may include only a single unit thermoelectric member 100 or a plurality of unit thermoelectric members 100.

Hereinafter, an example will be described in which the thermoelectric module 10 includes the plurality of unit thermoelectric members 100. In the instant case, a plurality of unit thermoelectric members 100 may be connected to a power supply unit in series or parallel.

For reference, the unit thermoelectric member 100 is an element that converts thermal energy and electrical energy and is also called a Peltier element, a thermoelectric cooler (TEC), or the like. The unit thermoelectric member 100 is widely used as a cooling or heating means using the Peltier effect in which when a current flows through the unit thermoelectric member 100, one portion (a high-temperature part) of the unit thermoelectric member 100 is heated, and the other portion (a low-temperature part) of the unit thermoelectric member 100 is cooled.

According to the exemplary embodiment of the present invention, the unit thermoelectric member 100 may include at least any one of an N-type thermoelectric material 110 and a P-type thermoelectric material 120. Hereinafter, an example will be described in which the unit thermoelectric member 100 includes both the N-type thermoelectric material 110 and the P-type thermoelectric material 120.

For example, the unit thermoelectric member 100 may include the N-type thermoelectric material 110, the P-type thermoelectric material 120 spaced from the N-type thermoelectric material 110, a first electrode 130 configured to electrically connect one end portion of the N-type thermoelectric material 110 and one end portion of the P-type thermoelectric material 120, and the second electrodes 140 respectively connected to the other end portion of the N-type thermoelectric material 110 and the other end portion of the P-type thermoelectric material 120.

The N-type thermoelectric material 110 and the P-type thermoelectric material 120 may be variously changed in numbers and arrangement patterns in accordance with required conditions and design specifications. For example, the N-type thermoelectric material 110 and the P-type thermoelectric material 120 may be disposed in a straight pattern (disposed in a straight shape). According to various exemplary embodiments of the present invention, the N-type thermoelectric material and the P-type thermoelectric material may be disposed in a curved pattern or other patterns. The present invention is not restricted or limited by the shapes and structures in which the N-type thermoelectric material and the P-type thermoelectric material are disposed.

For example, the N-type thermoelectric material 110 and the P-type thermoelectric material 120 may be provided to have a protruding rod shape. The N-type thermoelectric material 110 and the P-type thermoelectric material 120 may each be made of powder for typical thermoelectric semiconductor elements (e.g., at least one selected from a group consisting of Bi—Te-based alloy powder, Pb—Te-based alloy powder, Si—Ge-based alloy powder, Fe—Si-based alloy powder, and Co—Sb-based alloy powder). The present invention is not restricted or limited by the materials and properties of the N-type thermoelectric material 110 and the P-type thermoelectric material 120.

The first electrode 130 is provided to electrically connect one end portion (e.g., an upper end) of the N-type thermoelectric material 110 and one end portion (e.g., an upper end) of the P-type thermoelectric material 120.

The first electrode 130 is structured to be simultaneously connectable to the N-type thermoelectric material 110 and the P-type thermoelectric material 120. The present invention is not restricted or limited by the structure of the first electrode 130.

The first electrode 130 may be made of a typical metallic material which may be electrically connected to the N-type thermoelectric material 110 and the P-type thermoelectric material 120. The present invention is not restricted or limited by the material of the first electrode 130. For example, the first electrode 130 may be made of at least one material selected from a group consisting of copper (Cu), nickel (Ni), carbon (C), titanium (Ti), tungsten (W), silver (Ag), platinum (Pt), palladium (Pd), and aluminum (Al).

The second electrodes 140 are respectively connected (electrically connected) to the other end portion (e.g., a lower end) of the N-type thermoelectric material 110 and the other end portion (e.g., a lower end) of the P-type thermoelectric material 120. Power is applied to the second electrodes 140 from the power supply unit.

In the instant case, the application of power to the second electrodes 140 is defined as including the application of a forward current or a reverse current to the second electrodes 140. For example, when the forward current is applied to the second electrode 140, the unit thermoelectric member 100 may be heated (e.g., the first electrode may be defined as a high-temperature portion, and the second electrode may be defined as a low-temperature part). On the other hand, when the reverse current is applied to the second electrode 140, the unit thermoelectric member 100 may be cooled (e.g., the second electrode may be defined as a high-temperature portion, and the first electrode may be defined as a low-temperature part).

The second electrode 140 may be made of a typical metallic material which may be electrically connected to the N-type thermoelectric material 110 and the P-type thermoelectric material 120. The present invention is not restricted or limited by the material of the second electrode 140. As an example, the second electrode 140 may be made of at least one selected from a group consisting of copper (Cu), nickel (Ni), carbon (C), titanium (Ti), tungsten (W), silver (Ag), platinum (Pt), palladium (Pd), and aluminum (Al).

Meanwhile, in the exemplary embodiment of the present invention illustrated and described above, the example is described in which the second electrodes 140 are respectively connected to the other end portion of the N-type thermoelectric material 110 and the other end portion of the P-type thermoelectric material 120. However, in the case in which the thermoelectric module 10 includes the plurality of unit thermoelectric members 100 connected in series, the second electrode 140 may also be configured to electrically connect the two adjacent unit thermoelectric members 100. The two adjacent unit thermoelectric members 100 may share the single second electrode 140. For example, based on FIG. 1, the two adjacent unit thermoelectric members 100 may be electrically connected to each other through the second electrode 140.

Furthermore, in the exemplary embodiment of the present invention illustrated and described above, the example is described in which the unit thermoelectric member 100 is provided in a form of a block having a predetermined thickness. However, according to various exemplary embodiments of the present invention, the unit thermoelectric member may be provided in a form of a thin film having flexibility.

Referring to FIG. 1, FIG. 2, FIG. 3, and FIG. 4, the hydrophobic pattern 200 is provided to guide the condensate water, which is produced on the contact portion 102 of the thermoelectric module 10, to the outside of the contact portion 102.

According to the exemplary embodiment of the present invention, the hydrophobic pattern 200 may be disposed on an external surface (an upper surface based on FIG. 3) of the first electrode 130 that defines the contact portion 102.

As described above, the hydrophobic pattern 200 having hydrophobicity is disposed on the contact portion 102 (the portion that comes into contact with a subject) of the thermoelectric module 10, which makes it possible to inhibit the condensate water from adhering to or stagnating on the portion where the hydrophobic pattern 200 is provided. Therefore, it is possible to push out the condensate water, which is produced on the contact portion 102, toward the portion where no hydrophobic pattern 200 is provided, guiding the condensate water to the outside of the contact portion 102.

The hydrophobic pattern 200 may be made of various materials having hydrophobicity, and the present invention is not restricted or limited by the material and property of the hydrophobic pattern 200. For example, the hydrophobic pattern 200 may be made of a material such as Teflon (PTFE), a polymeric material such as P or PMMA, polydimethylsiloxane (PDMS), or Pluronic (F127).

The hydrophobic pattern 200 may be formed by applying or spraying a hydrophobic substance onto the contact portion 102 of the thermoelectric module 10. The present invention is not restricted or limited by the method of forming the hydrophobic pattern 200.

According to the exemplary embodiment of the present invention, the hydrophobic pattern 200 is provided to guide the condensate water, which is produced on an external surface of the first electrode 130, to an external region of the second electrode 140.

This is to allow the condensate water, which is guided to the outside of the contact portion 102 by the hydrophobic pattern 200, to fall into the external region of the second electrode 140, not onto an upper surface (based on FIG. 3) of the second electrode 140.

That is, the hydrophobic pattern 200 may be configured such that the condensate water, which is guided to the outside of the contact portion 102 by the hydrophobic pattern 200, falls onto the upper surface of the second electrode 140. However, the condensate water remaining on the upper surface of the second electrode 140 may degrade energy efficiency and the performance of the thermoelectric module 10 and make it difficult to stably supply power.

In contrast, according to the exemplary embodiment of the present invention, since the condensate water, which is guided to the outside of the contact portion 102 by the hydrophobic pattern 200, falls into the external region of the second electrode 140, the amount of condensate water remaining on the upper surface of the second electrode 140 may be minimized. Therefore, it is possible to obtain an advantageous effect of stably supplying power and minimizing the deterioration in performance of the thermoelectric module 10 caused by the condensate water.

The hydrophobic pattern 200 may have various structures in accordance with required conditions and design specifications. The present invention is not restricted or limited by the shape and structure of the hydrophobic pattern 200.

For example, the hydrophobic pattern 200 may include a first pattern 210 provided in a first direction and disposed on the external surface of the first electrode 130, and a second pattern 220 disposed on the external surface of the first electrode 130 and connected to the first pattern 210 to be directed in a second direction that intersects the first direction.

For example, the first pattern 210 and the second pattern 220 may cooperatively define an approximately 'T' shape.

According to various exemplary embodiments of the present invention, the hydrophobic pattern may have a 'C' shape, an 'S' shape, an 'X' shape, a 'U' shape, or the like.

Furthermore, in the exemplary embodiment of the present invention illustrated and described above, the example is described in which the hydrophobic pattern 200 is partially disposed on the external surface of the first electrode 130 which defines the contact portion 102. However, according to various exemplary embodiments of the present invention, the hydrophobic pattern may be disposed on the entire external surface of the first electrode.

The second electrode 140 may be provided in a longitudinal direction of the first electrode 130, and a portion of the second electrode 140 may be disposed to overlap the first electrode 130. The first pattern 210 may be provided to cover an outermost peripheral edge portion in the longitudinal direction (the left and right direction based on FIG. 3) of the first electrode 130.

As described above, the first pattern 210 may cover the outermost peripheral edge portion in the longitudinal direction of the first electrode 130, which makes it possible to inhibit the condensate water produced on the contact portion 102 from falling onto the upper surface of the second electrode 140 through the outermost peripheral edge portion in the longitudinal direction of the first electrode 130. Therefore, it is possible to obtain an advantageous effect of stably supplying power and minimizing the deterioration in performance of the thermoelectric module 10 caused by the condensate water.

According to the exemplary embodiment of the present invention, the thermoelectric module 10 may include absorbing members 300 connected to the unit thermoelectric members 100 and configured to absorb the condensate water.

As described above, the absorbing members 300 are provided, which makes it possible to inhibit the condensate water, which is pushed out from the contact portion 102, from falling at an inadvertent position thereof. Therefore, it is possible to obtain an advantageous effect of implementing a more comfortable usage environment and reducing displeasure.

The absorbing member 300 may be made of various materials capable of absorbing the condensate water. The present invention is not restricted or limited by the type and property of the absorbing member 300. For example, the absorbing member 300 may be made of a superabsorbent polymer (SAP), a phase change material (PCM), or the like.

For example, the absorbing member 300 may be connected to a lower portion of the second electrode 140, and the condensate water discharged from the contact portion 102 may be absorbed by the absorbing member 300 after flowing along the N-type thermoelectric material 110 (or the P-type thermoelectric material) and the second electrode 140.

According to various exemplary embodiments of the present invention, the absorbing member may be connected to a lateral surface of the second electrode (or the first electrode). Alternatively, the absorbing member may be connected to a lateral surface of the N-type thermoelectric material (or the P-type thermoelectric material).

According to the exemplary embodiment of the present invention, the thermoelectric module 10 may include a heat sink 400 connected to the unit thermoelectric member 100.

The heat sink 400 may be provided to discharge heat, which is generated from the unit thermoelectric member 100, to the outside of the unit thermoelectric member 100.

For example, the heat sink 400 may be connected to the lower portion (based on FIG. 4) of the second electrode 140.

As described above, the heat sink 400 may be connected to the unit thermoelectric member 100, and the heat, which exceeds a heat capacity of the unit thermoelectric member 100, may be discharged (transferred) to the heat sink 400 (e.g., the heat generated from the unit thermoelectric member may be discharged to the heat sink having a relatively high heat capacity). Therefore, it is possible to obtain an advantageous effect of further improving heat transfer efficiency and cooling performance of the thermoelectric module 10.

The heat sink 400 may be made of a porous material having pores 410. The pores 410 may be filled with the absorbing members 300.

The pore 410 may be provided in a form of a hole, a slot, a slit, or the like, and the present invention is not restricted or limited by the shape and structure of the pore 410.

Since the pores 410 of the heat sink 400 are filled with the absorbing members 300 as described above, it is possible to obtain an advantageous effect of simplifying the structure of the thermoelectric module and improving the spatial utilization and the degree of freedom of design of the thermoelectric module.

For reference, in the exemplary embodiment of the present invention illustrated and described above, the example is described in which the pores 410 of the heat sink 400 are filled with the absorbing members 300. However, according to various exemplary embodiments of the present invention, the heat sink and the absorbing member may be individually separated.

According to the exemplary embodiment of the present invention, the thermoelectric module 10 may include a fan 500 configured to generate a forced air flow toward the heat sink 400.

A typical axial fan or centrifugal fan may be used as the fan 500, and the present invention is not restricted or limited by the type and structure of the fan 500.

As described above, the fan 500 may be used to generate the forced air flow toward the heat sink 400, which makes it possible to cool the heat sink 400. Therefore, it is possible to obtain an advantageous effect of further improving the heat dissipation performance (heat capacity) of the heat sink 400.

Moreover, the fan 500 may not only cool the heat sink 400, but also dry the absorbing member 300 to remove the absorbed condensate water. Therefore, it is possible to obtain an advantageous effect of stably maintaining the water-absorbing performance of the absorbing member 300 and minimizing a leakage (e.g., dropping) of the condensate water to the outside.

Figure 5:
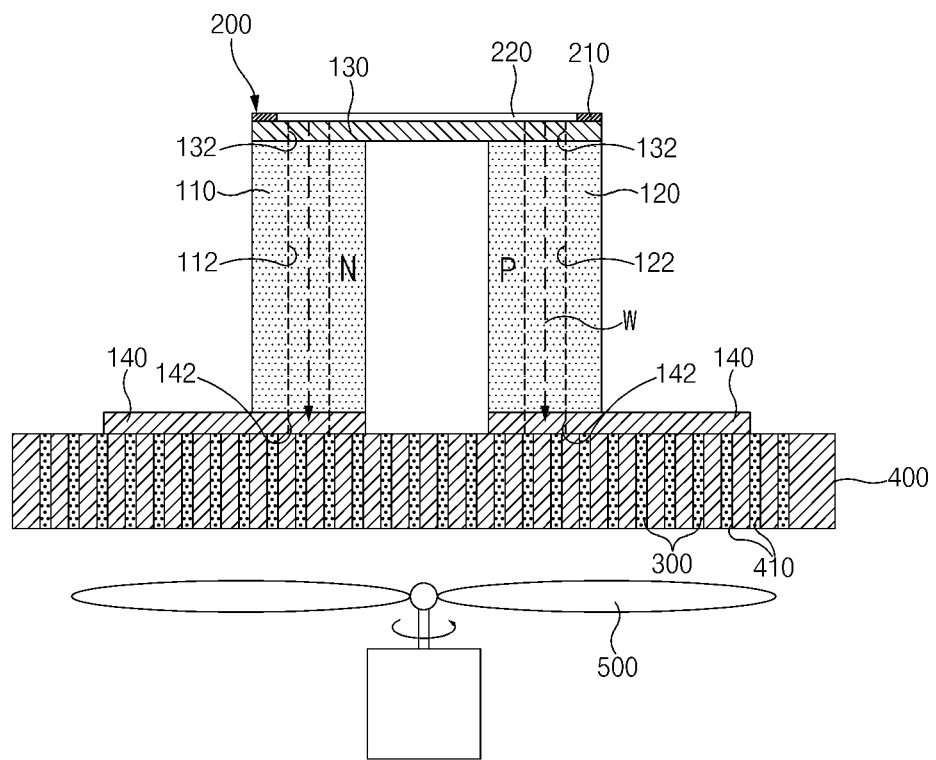
FIG. 5 is a view for explaining through-holes for discharging condensate water in the thermoelectric module according to the exemplary embodiment of the present invention.

Referring to FIG. 5, according to various exemplary embodiments of the present invention, the thermoelectric module 10 may include: first through-holes 132 provided by penetrating the first electrode 130 and configured to discharge the condensate water from the contact portion 102; second through-holes 112 and 122 provided in at least any one of the N-type thermoelectric material 110 and the P-type thermoelectric material 120 and configured to fluidically communicate with the first through-holes 132; and third through-holes 142 provided in the second electrodes 140 and configured to fluidically communicate with the second through-holes 112 and 122.

Hereinafter, an example will be described in which the second through-holes 112 and 122 are provided in the N-type thermoelectric material 110 and the P-type thermoelectric material 120, respectively.

For example, the first through-holes 132, the second through-holes 112 and 122, and the third through-holes 142 may each have a straight shape and continuously fluidically communicate with one another in the vertical direction (based on FIG. 5). According to various exemplary embodiments of the present invention, the first through-hole, the second through-hole, and the third through-hole may each have a curved shape or other shapes.

As described above, the thermoelectric module 10 may include the first through-holes 132, the second through-holes 112 and 122, and the third through-holes 142 that continuously fluidically communicate with one another, which makes it possible to discharge (W) the condensate water, which is produced on the contact portion 102, to the absorbing members 300 (or the lower portions of the second electrodes) through the first through-holes 132, the second through-holes 112 and 122, and the third through-holes 142. Therefore, it is possible to obtain an advantageous effect of minimizing the amount of condensate water stagnating (remaining) on the contact portion 102 and reducing the time required to discharge the condensate water.

Figure 6:
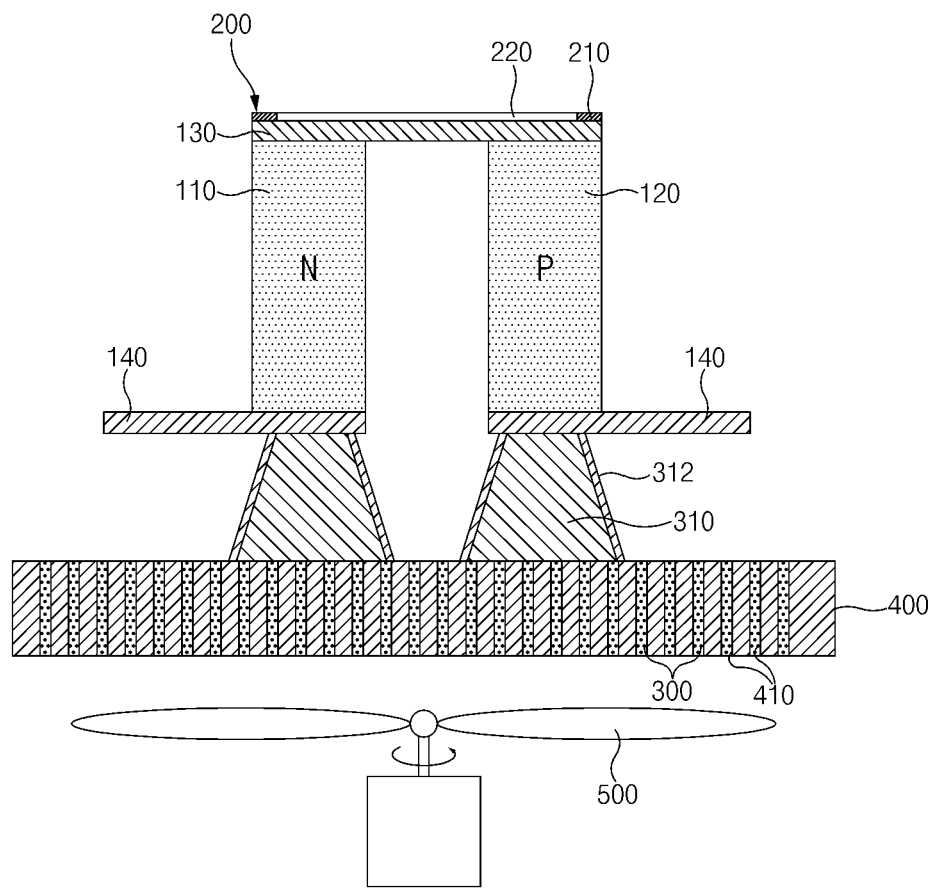
FIG. 6 is a view for explaining guide members of the thermoelectric module according to the exemplary embodiment of the present invention.

Referring to FIG. 6, according to various exemplary embodiments of the present invention, the thermoelectric module 10 may include guide members 310 provided between the unit thermoelectric member 100 and the absorbing members 300 and configured to guide the condensate water from the unit thermoelectric member 100 to the absorbing members 300.

The guide member 310 is provided to allow the condensate water W flowing downward along the unit thermoelectric member 100 to be rapidly and effectively absorbed by the absorbing members 300.

The guide member 310 may have various structures configured for guiding the condensate water to the absorbing members 300, and the present invention is not restricted or limited by the structure of the guide member 310.

For example, the guide member 310 may be provided to have a cross-sectional area (e.g., trapezoidal cross-sectional shape) that gradually increases from one end portion thereof (the upper end portion based on FIG. 6) adjacent to the unit thermoelectric member 100 toward the other end portion thereof (the lower end portion based on FIG. 6) adjacent to the absorbing member 300. Therefore, the condensate water flowing downward along the unit thermoelectric member 100 may be guided to the absorbing members 300 along an inclined surface of the guide member 310.

As described above, the guide member 310 may have the cross-sectional area that gradually increases from one end portion thereof toward the other end portion thereof, which makes it possible to disperse the condensate water, guided by the guide member 310, over a wider area. Therefore, it is possible to obtain an advantageous effect of further improving condensate water-absorbing efficiency and performance of the absorbing member 300.

A hydrophobic coating layer 312 may be disposed on a surface of the guide member 310.

The hydrophobic coating layer 312 may be made of the hydrophobic material (e.g., Teflon, a polymeric material such as P or PMMA, PDMS, or Pluronic) identical or similar to the material of the hydrophobic pattern 200. The present invention is not restricted or limited by the material and property of the hydrophobic coating layer 312.

As described above, the hydrophobic coating layer 312 may be disposed on the surface of the guide member 310, which makes it possible to allow the condensate water flowing downward along the surface of the guide member 310 to be more rapidly absorbed by the absorbing member 300.

According to the exemplary embodiment of the present invention described above, it is possible to obtain an advantageous effect of improving comfort while reducing displeasure.

According to the exemplary embodiment of the present invention, it is possible to obtain an advantageous effect of minimizing the stagnation of the condensate water produced on the contact portion of the thermoelectric module, which is in contact with the subject, improving comfort.

Furthermore, according to the exemplary embodiment of the present invention, it is possible to obtain an advantageous effect of minimizing the deterioration in performance of the thermoelectric module and improving the energy efficiency.

Furthermore, according to the exemplary embodiment of the present invention, it is possible to obtain an advantageous effect of minimizing a leakage of the condensate water to the outside and generating a fresh, comfortable usage environment.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A thermoelectric module comprising:
   a unit thermoelectric member having a contact portion configured to come into contact with a subject; and
   a hydrophobic pattern disposed on the contact portion and configured to guide condensate water produced on the contact portion, to the outside of the contact portion,
   wherein the unit thermoelectric member includes:
   an N-type thermoelectric material,
   a P-type thermoelectric material spaced from the N-type thermoelectric material,
   a first electrode electrically connecting a first end portion of the N-type thermoelectric material and a first end portion of the P-type thermoelectric material, and
   second electrodes respectively connected to a second end portion of the N-type thermoelectric material and a second end portion of the P-type thermoelectric material, and
   wherein the hydrophobic pattern is disposed on an external surface of the first electrode that defines the contact portion,
   a first through-hole provided by penetrating the first electrode and configured to discharge the condensate water from the contact portion through the first through-hole,
   a second through-hole provided in at least one of the N-type thermoelectric material and the P-type thermoelectric material and configured to fluidically communicate with the first through-hole, and
   a third through-hole provided in the second electrodes and configured to fluidically communicate with the second through-hole.

2. The thermoelectric module of claim 1, wherein the hydrophobic pattern guides the condensate water produced on the external surface of the first electrode, to an external region of the second electrodes.

3. The thermoelectric module of claim 1, wherein the hydrophobic pattern includes:
   a first pattern provided in a first direction and disposed on the external surface of the first electrode; and
   a second pattern disposed on the external surface of the first electrode and connected to the first pattern to be directed in a second direction that intersects the first direction.

4. The thermoelectric module of claim 3,
   wherein the second electrodes are provided in a longitudinal direction of the first electrode, and
   wherein the first pattern is provided to cover an outermost peripheral edge portion of the first electrode in the longitudinal direction of the first electrode.

5. The thermoelectric module of claim 4,
   wherein a portion of the second electrode is disposed to overlap the first electrode.

6. The thermoelectric module of claim 3,
   wherein the first pattern is provided in the first direction and disposed on the external surface of the first electrode on a first end portion of the first electrode and on a second end portion of the first electrode, and
   wherein the second pattern is connected to the first pattern disposed on the external surface of the first electrode on the first end portion of the first electrode and connected to the first pattern disposed on the external surface of the first electrode on the second end portion of the first electrode in the second direction.

7. The thermoelectric module of claim 6, wherein the contact portion is in a shape of "H" and symmetric with respect to a longitudinal axis of the first electrode.

8. The thermoelectric module of claim 1, wherein an absorbing member is connected to a bottom surface of the second electrodes.

9. A thermoelectric module comprising:
a unit thermoelectric member having a contact portion configured to come into contact with a subject;
a hydrophobic pattern disposed on the contact portion and configured to guide condensate water produced on the contact portion, to the outside of the contact portion;
an absorbing member connected to the unit thermoelectric member and configured to absorb the condensate water;
a guide member provided between the unit thermoelectric member and the absorbing member and configured to guide the condensate water from the unit thermoelectric member to the absorbing member through the guide member; and
a hydrophobic coating layer surrounding a surface of the guide member,
wherein the guide member has a cross-sectional area that increases from a first end portion thereof adjacent to the unit thermoelectric member toward a second end portion thereof adjacent to the absorbing member.

10. The thermoelectric module of claim 9, including:
a heat sink connected to the unit thermoelectric member.

11. The thermoelectric module of claim 10, wherein the heat sink includes a porous material having pores, and each of the pores is filled with the absorbing member.

12. The thermoelectric module of claim 10, including:
a fan configured to generate a forced air flow toward the heat sink.

* * * * *